United States Patent
Lai et al.

(10) Patent No.: US 7,442,980 B2
(45) Date of Patent: Oct. 28, 2008

(54) ANTI-PUNCH-THROUGH SEMICONDUCTOR DEVICE

(75) Inventors: Liang-Chuan Lai, Hsinchu County (TW); Pin-Yao Wang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 140 days.

(21) Appl. No.: 11/164,825

(22) Filed: Dec. 7, 2005

(65) Prior Publication Data
US 2007/0001257 A1   Jan. 4, 2007

(30) Foreign Application Priority Data
Jun. 30, 2005   (TW) .............................. 94122056 A

(51) Int. Cl.
*H01L 29/76* (2006.01)

(52) U.S. Cl. .................. 257/302; 257/328; 257/329; 257/330

(58) Field of Classification Search ................. 257/302, 257/328–332; 438/212, 242, 259, 268, 270, 438/271, 589
See application file for complete search history.

(56) References Cited

U.S. PATENT DOCUMENTS 4,890,144 A * 12/1989 Teng et al. .................... 257/66
5,763,310 A * 6/1998 Gardner ....................... 438/270

* cited by examiner

*Primary Examiner*—Hung Vu
(74) *Attorney, Agent, or Firm*—Jianq Chyun IP Office

(57) ABSTRACT

An anti-punch-through semiconductor device is provided. The anti-punch-through semiconductor device includes a substrate, at least an isolation region and a plurality of trench devices. The trench device is disposed in the substrate. The trench device includes a source/drain region. The source/drain region of the trench device is disposed at the bottom of the trench device. The isolation region is disposed in the substrate and between the source/drain regions of each trench device.

6 Claims, 5 Drawing Sheets

ANTI-PUNCH-THROUGH SEMICONDUCTOR DEVICE

CROSS-REFERENCE TO RELATED APPLICATION

This application claims the priority benefit of Taiwan application serial no. 94122056, filed on Jun. 30, 2005. All disclosure of the Taiwan application is incorporated herein by reference.

BACKGROUND OF THE INVENTION

1. Field of Invention

The present invention relates to a semiconductor device and a manufacturing method thereof. More particularly, the present invention relates to an anti-punch-through semiconductor device and a manufacturing method thereof.

2. Description of Related Art

Along with the rapid development of the integrated circuit industry and the trend of high integration, the size of the entire circuit device is forced to be minimized to meet the requirement. When the size of the semiconductor reduces gradually, the distance between devices also relatively reduces. When the distance reduces to some degree, the process problem due to the high integration of device may occur. Therefore, it is a common objective in the industry to produce a semiconductor device with small size, high integration and high quality.

FIG. 1 is a schematic cross-sectional view of a conventional trench device. Referring to FIG. 1A, a plurality of trenches 102 is formed in the substrate 100, and the trench device is disposed in the trench 102. The trench devices are trench memories, and the trench memories includes a floating gate 104, a dielectric layer 106, and a control gate 108. Moreover, the trench device further includes a source/drain region 110 disposed in the substrate under the floating gate 104, the dielectric layer 106 and the control gate 108.

However, along with increased integration, in the process of forming the gate made of doped polysilicon, the dopant may diffuse into the source/drain region 110 to extend the region, which may easily cause the abnormal electric punch-through in the adjacent source/drain regions 110. The problem of the electric punch-through may cause abnormal electric connection between adjacent trench devices, which may result in low operation speed and low performance efficiency, and even short or open circuit of the devices. Accordingly, the yield and reliability of the whole process are adversely affected.

SUMMARY OF THE INVENTION

Accordingly, the present invention is directed to a manufacturing method of an anti-punch-through semiconductor device, wherein an isolation region can be formed between adjacent source/drain regions to avoid electric punch-through between the devices from affecting the performance efficiency of the devices.

Another objective of the present invention is to provide an anti-punch-through semiconductor device, wherein, the isolation region between the source/gate regions can avoid the electric punch-through between the devices.

The present invention provides a manufacturing method of anti-punch-through semiconductor device. First, a substrate is provided. Next, an insulation layer is formed on the substrate. Next, the insulation layer is patterned to form a plurality of isolation regions. Next, a silicon layer is formed on the substrate to cover the isolation region. Next, a trench is formed between each adjacent isolation region. Thereafter, a trench device is formed in each trench. Moreover, the trench device further includes a source/drain region formed in the silicon layer under the trench and between two adjacent isolation regions.

In the manufacturing method of anti-punch-through semiconductor device according to the embodiment of the present invention, the material of the insulation layer is, for example, silicon oxide.

In the manufacturing method of anti-punch-through semiconductor device according to the embodiment of the present invention, the thickness of the insulation layer is, for example, about 100 Å-1000 Å.

In the manufacturing method of anti-punch-through semiconductor device according to the embodiment of the present invention, the shape of the isolation region includes block or parallel stripes.

In the manufacturing method of anti-punch-through semiconductor device according to the embodiment of the present invention, the method of forming the source/drain region is, for example, ion-implanting method.

In the manufacturing method of anti-punch-through semiconductor device according to the embodiment of the present invention, the trench device is, for example, a trench memory.

In the manufacturing method of anti-punch-through semiconductor device according to the embodiment of the present invention, after the trench memory is formed, a dielectric layer is formed on the silicon layer to cover the trench memory, and a conductive layer is formed on the dielectric layer.

The present invention also provides an anti-punch-through semiconductor device, comprising a substrate, a plurality of trench devices and at least one insulation region. The trench device is disposed in the substrate, wherein the trench device includes a source/drain region, and the source/drain region is disposed in the bottom of the trench device. The insulation layer is disposed in the substrate and between the source/drain regions of each trench device.

According to the anti-punch-through semiconductor device in the embodiment of the present invention, the thickness of the insulation layer is, for example, about 1000 Å-1000 Å.

According to the anti-punch-through semiconductor device in the embodiment of the present invention, the material of the insulation layer is, for example, silicon oxide.

According to the anti-punch-through semiconductor device in the embodiment of the present invention, the shape of the isolation region includes block or parallel stripes.

According to the anti-punch-through semiconductor device in the embodiment of the present invention, the trench device is, for example, a trench memory.

In the present invention, an isolation region is formed between two adjacent trench devices, so as to avoid adjacent source/drain regions during the ion-implanting process of forming the doped polysilicon from the electric punch-though as the dopant diffuses into the source/drain region to extend the region. And, the problem of the low operation speed and low performance efficiency due to the electric punch-through and reduced yield and reliability of the whole process, can also be avoided.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 2A to FIG. 2G are cross-sectional views showing the flowcharts of manufacturing the anti-punch-through semiconductor device according to the embodiment of the present invention. The trench memory is described in the following as an example.

Figure 1:
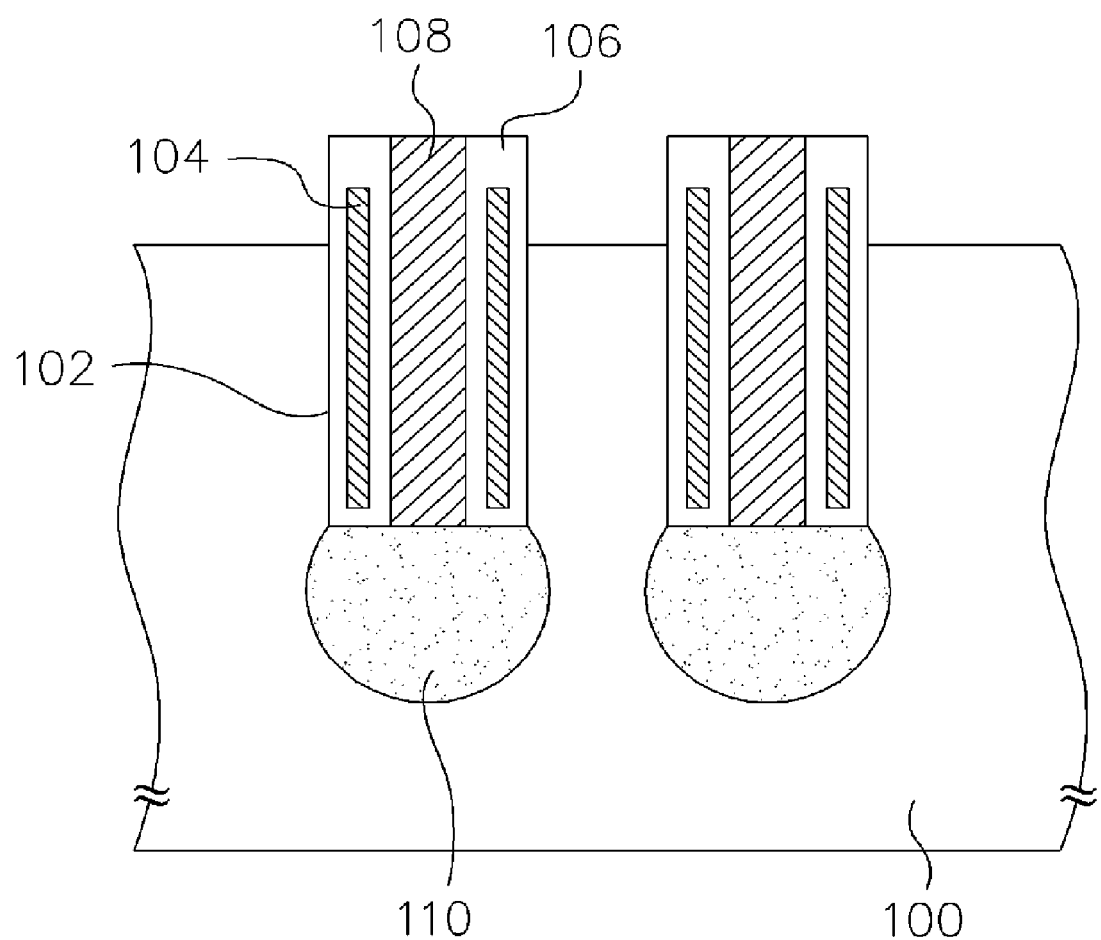
FIG. 1 is a schematic cross-sectional view of a conventional trench device.
Figure 2A:
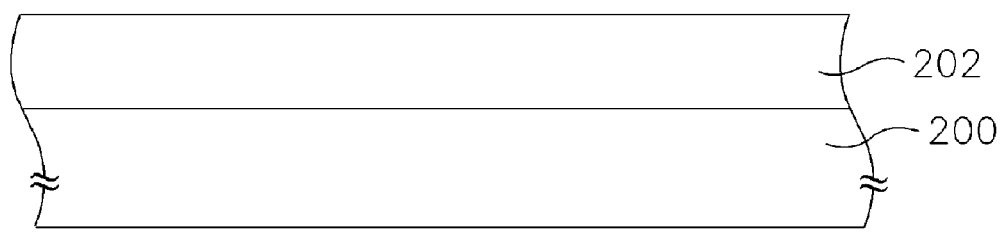
FIG. 2A to FIG. 2G are cross-sectional views showing the flowchart of fabricating the anti-punch-through semiconductor device.

First, referring to FIG. 2A, a substrate 200 is provided, and the substrate 200 is, for example, a silicon substrate. Next, an insulation layer 202 is formed on the substrate 200. Wherein, the material of the insulation layer is, for example, silicon oxide, and the thickness of the insulation layer 202 is about 1000 Å-10000 Å, and the forming method is, for example, a chemical vapor deposition process.

Figure 2B:
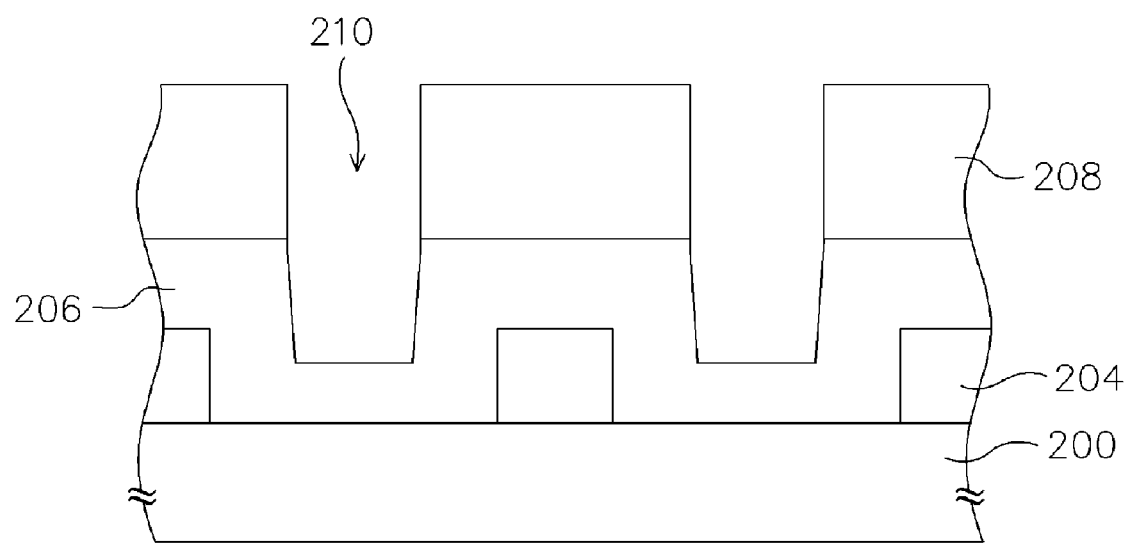

Next, referring to FIG. 2B, the insulation layer 202 is patterned by photolithography process and etching process, and an isolation region 204 is formed on the substrate 200. Note that the isolation region is different from the shallow trench isolation structure used to form the active region. The isolation region of the present invention is formed deeper in the substrate than the shallow trench isolation structure. Moreover, the shape of the isolation region 204 includes block or parallel stripes.

Next, referring to FIG. 2B, a silicon layer 206 is formed on the substrate 200 to cover the isolation region 204. Wherein, the method of forming the silicon layer 206 is, for example, a chemical vapor deposition process. Next, the silicon layer 206 is planarized, and the method of the planarization is, for example, a chemical mechanical polishing process. Next, a patterned mask layer 208 is formed on the silicon layer 206. Wherein, the material of the patterned mask layer 208 is, for example, silicon nitride. Thereafter, the silicon layer 206 is etched to form the trench 210 in the silicon layer 206 between two adjacent isolation regions 204 by using the patterned mask layer 208 as a mask.

Figure 2C:
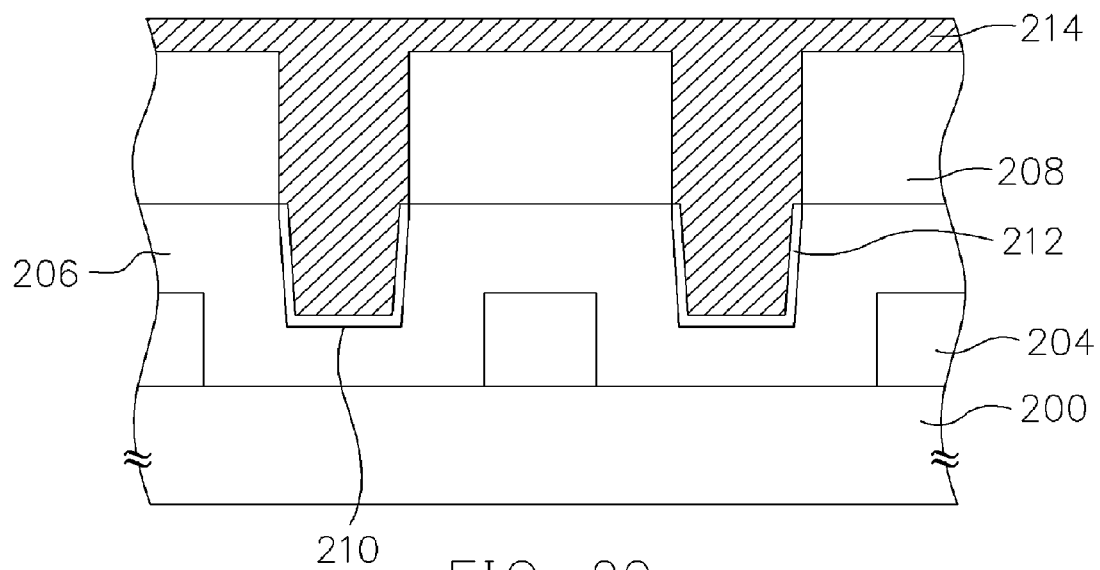

Next, referring to FIG. 2C, a tunnel oxide layer 212 is formed on the surface of the trench 210. Wherein, the material of the tunnel oxide layer 212 is, for example, silicon oxide, and the method of forming the tunnel oxide layer 212 is, for example, a thermal oxidation process. Next, a conductive layer 214 is formed on the silicon layer 206 and fills in the trench 210. Wherein, the material of the conductive layer 214 is, for example, doped polysilicon, and the forming method is, for example, by performing an ion-planting process after a non-doped polysilicon layer is formed in a chemical vapor deposition process.

Figure 2D:
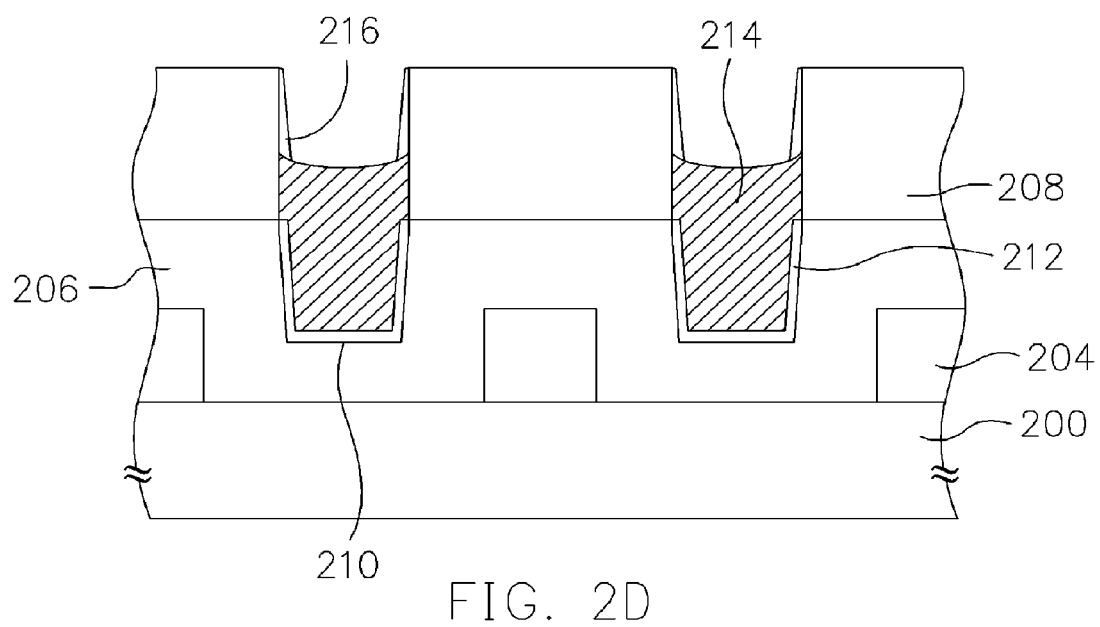

Next, referring to FIG. 2D, the conductive layer 214 is removed from the patterned mask layer 208. Wherein, the removing method is, for example, a chemical mechanical polishing process. Next, an etching back process is performed to etch a part of conductive layer 214, so that the top of the conductive layer 214 is higher than the surface of the silicon layer 206 and lower than the surface of the patterned mask layer 208. Next, a spacer 216 is formed to cover a part of the surface of the conductive layer 214. Wherein, the method of forming the spacer 216 is, for example, by forming an insulation material layer (not shown), then removing a part of the insulation material layer in a non-isotropic etching process.

Figure 2E:
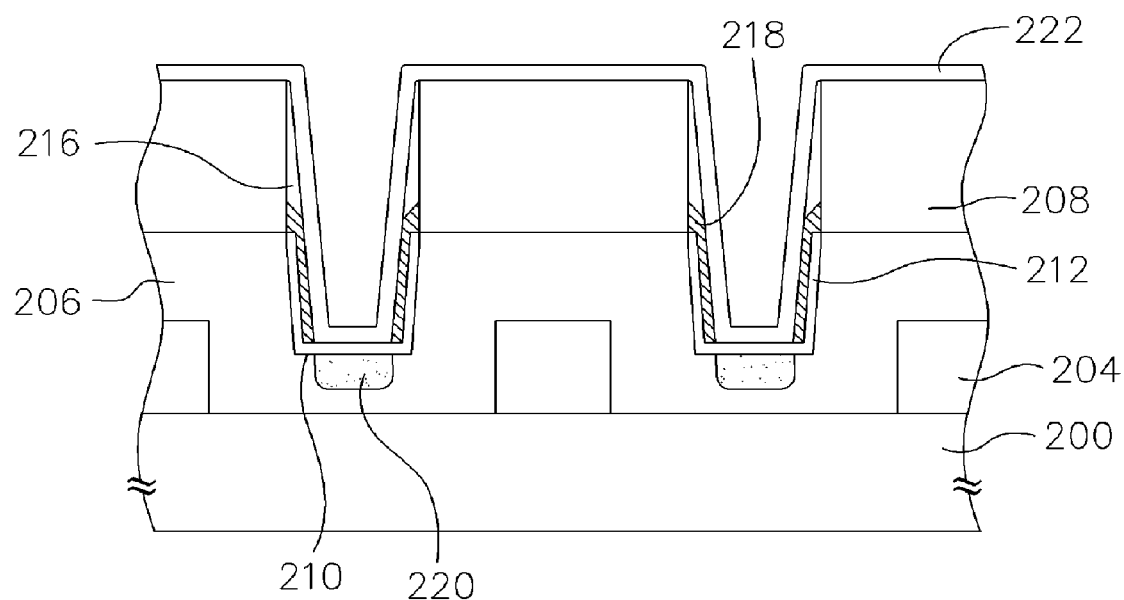

Next, referring to FIG. 2E, an etching process is performed to form a floating gate 218 on the sidewall of the trench 210 by using the patterned mask layer 208 and the spacer 216 as the mask. Next, a source/drain region 220 is formed in the substrate 200 on the bottom of the trench 210, and the source/drain region 220 is disposed between two adjacent isolation regions 204. Wherein, the method of forming the source/drain region 220 is, for example, an ion-planting process. Next, a dielectric layer 222 is formed on the substrate 200. Wherein, the dielectric layer 222 can be a compound layer composed of silicon oxide layer, silicon nitride layer and silicon oxide layer in sequence from the bottom up. Of course, the dielectric layer 222 can also include only silicon oxide layer/silicon nitride layer or only a silicon oxide layer. The method of forming the dielectric layer 222 is, for example, a chemical vapor deposition process.

Figure 2F:
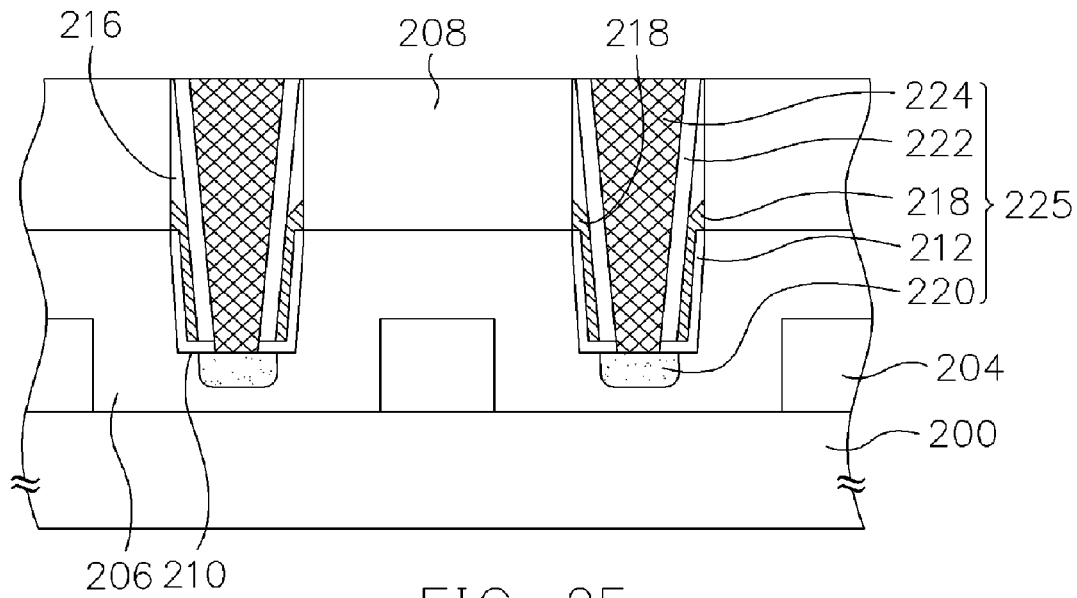

Next, referring to FIG. 2F, a part of the tunnel oxide layer 212 and the dielectric layer 222 disposed on the bottom of the trench 210 are removed to expose the substrate 200. Wherein, the removing method is, for example, a non-isotropic etching process. Next, a doped polysilicon layer (not shown) is formed on the substrate 200, and a part of the doped polysilicon layer is removed in a chemical mechanical polishing process to form the control gate 224. In the embodiment, note that the tunnel oxide layer 212, the floating gate 218, the dielectric layer 222, the control gate 224 and the source/drain region 220 are called a trench device 225.

Figure 2G:
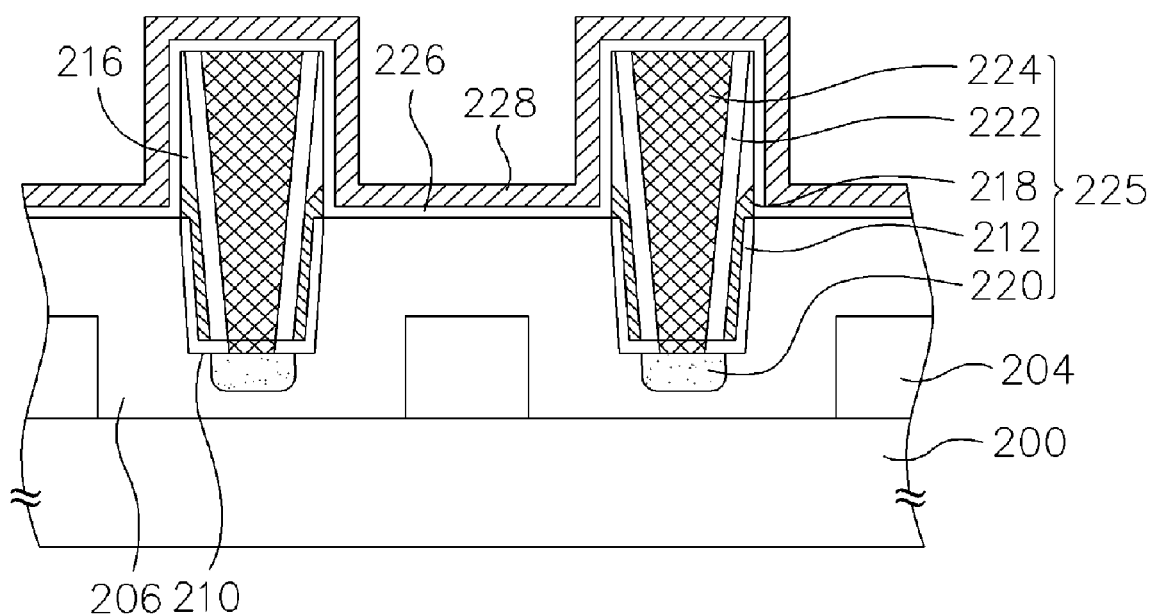

Next, referring to FIG. 2G, the patterned mask layer 208 is removed. Next, a dielectric layer 226 is formed on the trench device 225 and the silicon layer 206. Wherein, the material of the dielectric layer 226 is, for example, silicon oxide. Then, a conductive layer 228 is formed on the dielectric layer 226. Wherein, the material of the conductive layer 228 is, for example, doped polysilicon. In the embodiment, the conductive layer 228 is used as word line.

Moreover, in the trench memory (as shown in FIG. 2G) provided by the present invention, as an isolation region is provided between the source/drain regions in two adjacent trench devices, the abnormal electric punch-through between two source/drain region, which affects the performance of the devices, can be avoided by the isolation region.

In summary, an isolation region is formed between the source/drain under two adjacent trench memories, therefore, with increased integration, in the process of forming the gate with the material of doped polysilicon, the implanted dopant can be prevented from diffusing into the source/drain region to extend the source/drain region resulting in abnormal electric punch-through between adjacent devices. Meanwhile, the problem of short or open circuit of the devices resulting from the electric punch-through, which may reduce the yield and reliability of the whole process, can also be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An anti-punch-through semiconductor device, comprising:
    a silicon layer;
    a plurality of trench devices, disposed in the silicon layer, wherein the trench device comprises a source/drain region, and the source/drain region is disposed in the bottom of the trench device; and s
    at least one insulation region, covered by the silicon layer and disposed between the source/drain regions of each trench device.

2. The anti-punch-through semiconductor device of claim 1, wherein the thickness of the at least one insulation region is about 100 Å-1000 Å.

3. The anti-punch-through semiconductor device of claim 1, wherein the material of the at least one insulation region includes silicon oxide.

4. The anti-punch-through semiconductor device of claim 1, wherein the shape of the at least one insulation region includes blocks or parallel stripes.

5. The anti-punch-through semiconductor device of claim 1, wherein the trench device includes trench memory.

6. The anti-punch-through semiconductor device of claim 1, further comprising a substrate, and the silicon layer and the at least one insulation region are both disposed on the substrate.

* * * * *